United States Patent
Heim

(10) Patent No.: US 10,394,332 B2
(45) Date of Patent: *Aug. 27, 2019

(54) SENSOR DESIGN FOR ENHANCED TOUCH AND GESTURE DECODING

(71) Applicant: Microchip Technology Germany GmbH, Rosenheim (DE)

(72) Inventor: Axel Heim, Munich (DE)

(73) Assignee: MICROCHIP TECHNOLOGY GERMANY GMBH, Rosenheim (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/481,133

(22) Filed: Apr. 6, 2017

(65) Prior Publication Data
US 2017/0293362 A1    Oct. 12, 2017

Related U.S. Application Data

(60) Provisional application No. 62/319,480, filed on Apr. 7, 2016.

(51) Int. Cl.
*G06F 3/01* (2006.01)
*G06F 3/044* (2006.01)
(Continued)

(52) U.S. Cl.
CPC .......... *G06F 3/017* (2013.01); *G06F 3/03547* (2013.01); *G06F 3/044* (2013.01);
(Continued)

(58) Field of Classification Search
CPC .................. G06F 3/044; G06F 3/0412; G06F 2203/04101; G06F 3/017; G06F 3/0416;
(Continued)

(56) References Cited

U.S. PATENT DOCUMENTS

| | | | |
|---|---|---|---|
| 9,946,397 B2* | 4/2018 | Dorfner | G06F 3/0416 |
| 2011/0062971 A1* | 3/2011 | Badaye | G06F 3/044 |
| | | | 324/686 |

(Continued)

FOREIGN PATENT DOCUMENTS

WO   2016/205268 A1   12/2016   ............. G06F 3/044

OTHER PUBLICATIONS

International Search Report and Written Opinion, Application No. PCT/EP2017/058444, 12 pages, dated Jun. 8, 2017.

(Continued)

*Primary Examiner* — Sanjiv D. Patel
(74) *Attorney, Agent, or Firm* — Slayden Grubert Beard PLLC

(57) ABSTRACT

A sensor arrangement for capacitive touch and non-touch detection has a transmission electrode and a predefined number of receiving electrodes coupled with an evaluation unit. The evaluation unit operates in a non-touch detection mode and in a touch detection mode, wherein the transmission electrode generates an alternating electric near field, and in the non-touch detection mode, the evaluation unit evaluates signals from the receiving electrodes to determine non-touch gestures or a three-dimensional position of an object. In the touch detection mode a surface touch detection area defined by the predefined number of electrodes is divided into a plurality of segments wherein within each segment at least two electrodes of the predefined number of electrodes contribute with a portion of their electrode surface area such that different electrode surface area ratios are formed for each of the plurality of segments.

37 Claims, 9 Drawing Sheets

(51) Int. Cl.
*H03K 17/96* (2006.01)
*G06F 3/0354* (2013.01)

(52) U.S. Cl.
CPC ............... *H03K 17/9622* (2013.01); *G06F 2203/04101* (2013.01); *G06F 2203/04104* (2013.01); *H03K 2017/9602* (2013.01)

(58) Field of Classification Search
CPC . G06F 2203/04108; G06F 2203/04104; G06F 2203/04112
See application file for complete search history.

(56) References Cited

U.S. PATENT DOCUMENTS

| | | | |
|---|---|---|---|
| 2013/0050105 A1* | 2/2013 | Lee | G06F 3/044 345/173 |
| 2013/0176262 A1* | 7/2013 | Hsu | G06F 3/044 345/174 |
| 2013/0181942 A1* | 7/2013 | Bulea | G06F 3/044 345/174 |
| 2013/0194519 A1 | 8/2013 | Ivanov | 349/12 |
| 2013/0234739 A1* | 9/2013 | Deng | G06F 3/044 324/686 |
| 2013/0249855 A1 | 9/2013 | Zhang | 345/174 |
| 2014/0238834 A1* | 8/2014 | Heim | H03K 17/9622 200/600 |
| 2014/0267138 A1* | 9/2014 | Curtis | G06F 3/044 345/174 |
| 2014/0327845 A1* | 11/2014 | Yashiro | G06F 3/044 349/12 |
| 2014/0347309 A1* | 11/2014 | Mockarram-Dorri | G01R 27/2605 345/174 |
| 2014/0354301 A1* | 12/2014 | Trend | G06F 3/044 324/658 |
| 2015/0160754 A1* | 6/2015 | Wenzel | G06F 3/044 345/174 |
| 2015/0370363 A1* | 12/2015 | Trend | G06F 3/044 345/174 |
| 2016/0011692 A1* | 1/2016 | Heim | G06F 3/017 345/174 |
| 2016/0054754 A1* | 2/2016 | Aubauer | G06F 1/16 345/174 |
| 2016/0364074 A1* | 12/2016 | Dorfner | G06F 3/0416 |
| 2017/0177112 A1* | 6/2017 | Chen | G06F 3/044 |

OTHER PUBLICATIONS

Microchip Technology Incorporated, "MGC3130—Sabrewing Single-Zone Evaluation Kit User's Guide," URL: http://ww1.microchip.com/downloads/en/DeviceDoc/41685A.pdf, 34 pages, ©2013.

* cited by examiner

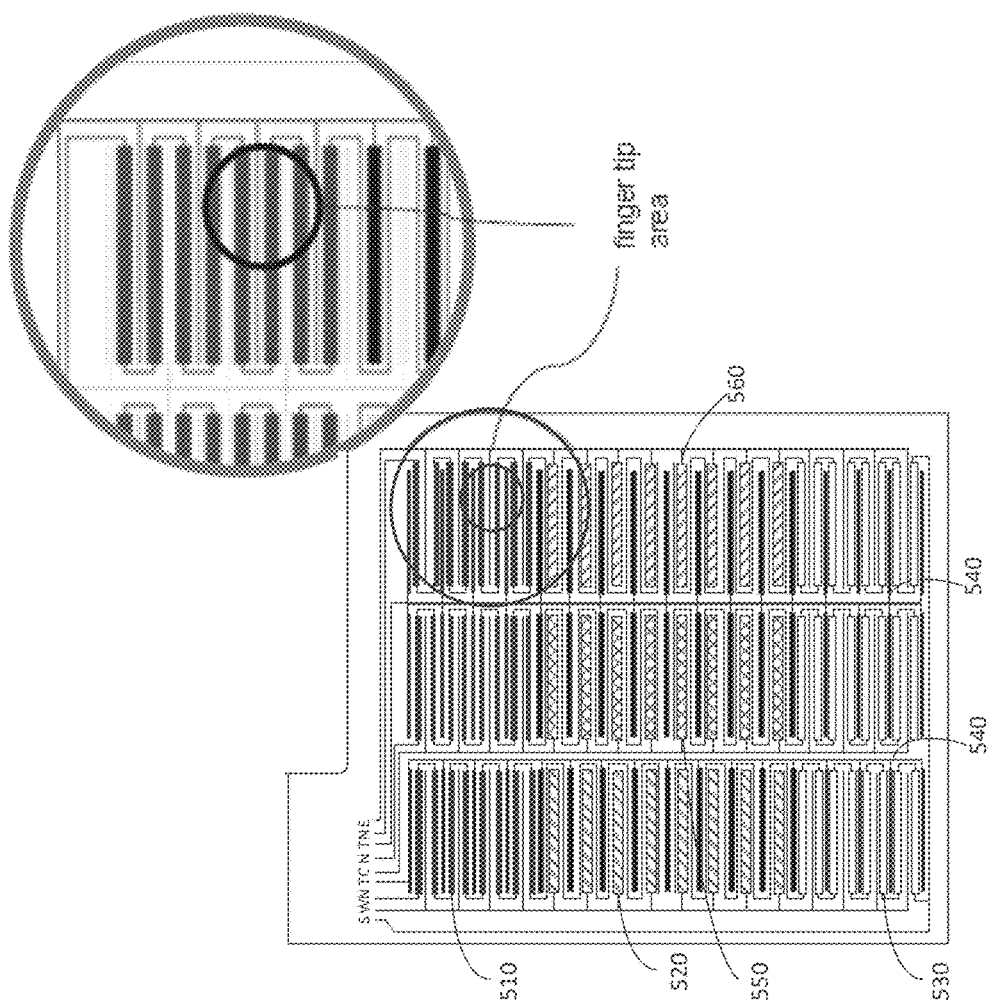

SENSOR DESIGN FOR ENHANCED TOUCH AND GESTURE DECODING

RELATED PATENT APPLICATION

This application claims priority to commonly owned U.S. Provisional Patent Application No. 62/319,480 filed Apr. 7, 2016, which is hereby incorporated by reference herein for all purposes.

TECHNICAL FIELD

The present disclosure relates to capacitive sensing systems and method of operating such, in particular to an electrode arrangement for a capacitive sensing system using electric field effects.

BACKGROUND

A three-dimensional capacitive non-touching detection system generates a quasi-static electric field wherein disturbances in that field that are caused by an object entering the field are evaluated. The evaluation allows for a determination of a three-dimensional location of the object, such as a finger of a user, and to track its position to further determine whether a gesture from a predefined pool of gestures has been performed. Such a system can also operate as a three-dimensional touchless mouse or control any kind of suitable operations without requiring a touch. The system usually uses a transmitting electrode receiving an alternating signal such as a sinusoidal or square wave signal, for example, having a frequency of 40-250 kHz, to generate the quasi-static alternating electric field. Contrary to, for example, mutual or self capacitance measurements, during measurement the transmitting electrode is supplied permanently with the generator signal and disturbances in the generated field are measured while the field is permanently upheld. The system does not evaluate single pulses, voltages generated by single or multiple pulses and associated charge changes of the sensor electrodes as it is common in capacitance measurement systems, for example, a capacitive voltage divider or a charge time measurement unit used for mutual or self capacitance measurements. In some embodiments, a plurality of receiving electrodes are arranged above a transmitting electrode, for example in a frame-like fashion within a plane to evaluate the quasi-static electric field generated by the transmitting electrode, and from received signals a three-dimensional position of an object can be reconstructed within an integrated circuit device through signal processing. In other embodiments, the same electrodes are used for transmitting and receiving and while still the same electric field is generated, the evaluation measures a load on each transmitter/receiver electrode caused by a disturbance in the electric field.

An example of such a device is the "GestiC®" integrated circuit, also known as MGC3130 manufactured by the assignee of this application. This device is a highly sensitive capacitive sensing technology that can be used for three-dimensional touch-less gesture detection and tracking using a quasi-static alternating electric near field, for example around 40-250 kHz.

SUMMARY

There exists a need to decode multiple touch positions independent of frame based electrode design. For example, there exists a need to extend the number of touch positions to a value greater than n when using only n receiving electrodes. In particular, there exists a need to extend the number of touch positions to a value greater than five when using only five receiving electrodes.

According to an embodiment, a sensor arrangement for capacitive touch and non-touch detection, may comprise a transmission electrode and a predefined number of receiving electrodes coupled with an evaluation unit, wherein the evaluation unit operates in a non-touch detection mode and in a touch detection mode, wherein the transmission electrode generates an alternating electric near field, and in the non-touch detection mode, the evaluation unit evaluates signals from the receiving electrodes to determine non-touch gestures or a three-dimensional position of an object; and in the touch detection mode a surface touch detection area defined by the predefined number of electrodes is divided into a plurality of segments wherein within each segment at least two electrodes of the predefined number of electrodes contribute with a portion of their electrode surface area such that different electrode surface area ratios are formed for each of the plurality of segments.

According to a further embodiment, each segment may define a virtual touch button and the number of virtual touch buttons is greater than the number of electrodes. According to a further embodiment, each segment may comprise two contributing receiving electrodes. According to a further embodiment, each segment may comprise three contributing receiving electrodes. According to a further embodiment, an electrode surface area of each of the two contributing receiving electrodes within a segment can be selected from a first surface area and a second surface area, wherein the first surface area is larger than the second surface area. According to a further embodiment, the predefined number of electrodes can be five and signals from at least four receiving electrodes are used in the non-touch detection mode. According to a further embodiment, the predefined number of electrodes can be four and signals from all four receiving electrodes are used in the non-touch detection mode. According to a further embodiment, the sensor arrangement can be operating in the non-touch mode and automatically switches into the touch detection mode upon detection of an object being below a predefined threshold distance to a touch surface. According to a further embodiment, the predefined number of electrodes can be arranged in an interleaved fashion, wherein in the non-touch gesture detection mode four of the electrodes of the predefined number of electrodes provide for a frame-like arrangement. According to a further embodiment, a touch of a virtual touch button can be decoded by two contributing electrodes from the plurality of receiving electrodes. According to a further embodiment, the two contributing electrodes can be selected from the plurality of electrodes by signal strength of signals received by a respective receiving electrode. According to a further embodiment, the predefined number of receiving electrodes can be five and the five receiving electrodes are arranged in an interleaved fashion to provide said plurality of segments, wherein the segments are arranged in a matrix covering the surface touch detection area. According to a further embodiment, the matrix may provide for 5×4 segments. According to a further embodiment, the matrix may provide for 3×4 segments and wherein two of the five receiving electrodes may provide for an additional slider function. According to a further embodiment, two of the receiving electrodes can be arranged in interdigital fashion, each receiving electrode having a plurality of fingers, and wherein a width of the fingers of each electrode is varied to provide for an slider function. According to a further embodiment, each receiving electrode may have a plurality of fingers and wherein pairs of receiving electrodes are arranged in interdigital fashion along a line to form a row of adjacent segments, each segment defining a virtual button. According to a further embodiment, the line can be a straight line or the line can be curved. According to a further embodiment, four electrodes can be arranged in an interleaved fashion to provide for twelve touch locations. According to a further embodiment, at least one Rx or Tx electrode may have a meander shape. According to a further embodiment, the transmission electrode and a predefined number of receiving electrodes can be arranged in the same layer. According to a further embodiment, the electrode density of at least one electrode, in particular of at least to electrodes, may gradually increase or decrease along a direction of the electrode arrangement.

According to another embodiment, a method for performing a capacitive touch and non-touch detection may comprise feeding an alternating signal to a transmission electrode to generate an alternating electric near field and operating an evaluation unit coupled with a predefined number of receiving electrodes in a non-touch detection mode and in a touch detection mode, wherein in the non-touch detection mode, the evaluation unit evaluates signals from the receiving electrodes to determine a three-dimensional position of an object; and in the touch detection mode a surface touch detection area defined by the predefined number of receiving electrodes is divided into a plurality of segments wherein within each segment at least two electrodes of the predefined number of electrodes contribute with a portion of their electrode surface area such that different electrode surface area ratios are formed for each of the plurality of segments and wherein the evaluation unit evaluates signals from a variety of at least two of the predefined number of receiving electrodes to determine a touch location.

According to a further embodiment of the method, each segment may define a virtual touch button and the number of virtual touch buttons is greater than the number of electrodes. According to a further embodiment of the method, each segment may comprise two contributing receiving electrodes. According to a further embodiment of the method, an electrode surface area of each of the two contributing receiving electrodes within a segment can be selected from a first surface area and a second surface area, wherein the first surface area is larger than the second surface area. According to a further embodiment of the method, the predefined number of electrodes can be five and signals from all five receiving electrodes are used in the non-touch detection mode. According to a further embodiment of the method, the predefined number of electrodes can be four and signals from all four receiving electrodes are used in the non-touch detection mode. According to a further embodiment of the method, the sensor arrangement can be operating in the non-touch mode and automatically switches into the touch detection mode upon detection of an object being below a predefined threshold distance to a touch surface. According to a further embodiment of the method, the predefined number of electrodes can be arranged in an interleaved fashion, wherein in the non-touch gesture detection mode four of the electrodes of the predefined number of electrodes provide for a frame-like arrangement. According to a further embodiment of the method, a touch of a virtual touch button can be decoded by two contributing electrodes from the plurality of receiving electrodes. According to a further embodiment of the method, the two contributing electrodes can be selected from the plurality of electrodes by signal strength of signals received by a respective receiving electrode. According to a further embodiment of the method, two of the receiving electrodes can be arranged in interdigital fashion, each receiving electrode having a plurality of fingers, and wherein a width of the fingers of each electrode is varied, the method further comprising evaluating signals from said two of the receiving electrodes to provide for a slider function. According to a further embodiment of the method, at least one Rx or Tx electrode may have a meander shape.

BRIEF DESCRIPTION OF THE DRAWINGS

FIGS. 6A and 6B show electrode structures and PCB according to a fourth embodiment;

DETAILED DESCRIPTION

Industrial displays can be equipped with predefined touch input and three-dimensional (3D) gesture detection. Similarly, keypads can be equipped with such additional functionality. For example, a three-dimensional gesture system as described above can be enhanced to also provide for an improved touch detection according to various embodiments.

Some embodiments cover a single layer interleaved electrode structure for multiple button decoding and 3D gesture recognition. The interleaved electrode structure thereby provides a similar structure compared to a conventional 3D gesture detection electrode arrangement. According to various embodiments, a meander shaped electrode design allows for a coarse 2D touch position detection, an increased detection range, larger designs, and a single layer printed circuit board design which leads to further cost reduction.

According to some arrangements, an unaltered electrode arrangement can be used. In either arrangement, each virtual button will be decoded with their signal ratio of two or more electrodes. Therefore, for example, the two electrodes which show the highest signal shift within a set of n buttons are taken for decoding. Besides the button decoding, it is important to have a general electrode placement to maintain meaningful signal patterns for 3D gesture decoding. The general placement is a frame based design as for example shown in FIG. 2.

Button decoding is usually performed with touch sensors only. However, according to various embodiments, a 3D gesture system can be enhanced by improved signal processing and a new electrode design to also provide this functionality with a unique decoding technique.

A low cost solution for industrial displays applications generally support predefined touch positions, sliders and may also provide for detecting a full 3D gesture set. A low cost solution for keypad/button applications may support predefined touch positions, sliders and full 3D gesture set.

Figure 2:
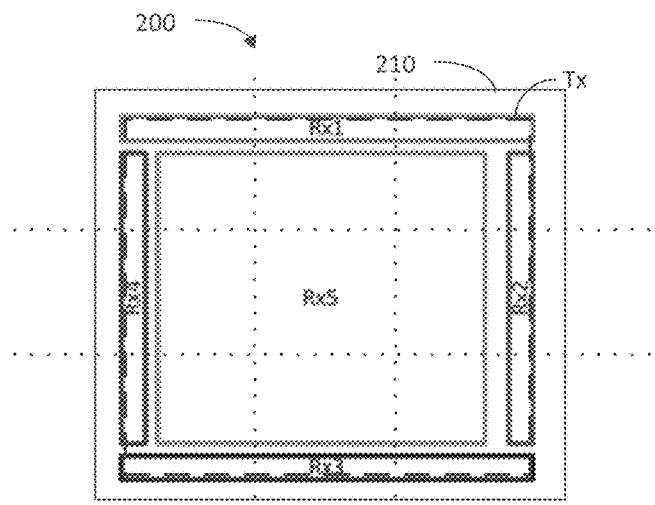
FIG. 2 shows an electrode structure according to a first embodiment.
Figure 3:
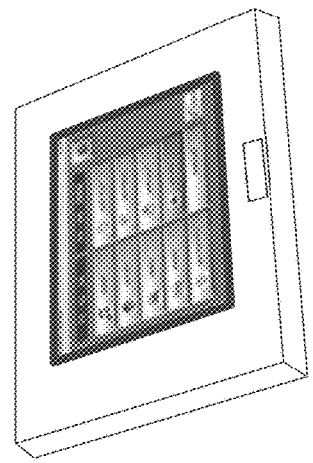
FIG. 3 shows an electrode structure according to a second embodiment.

As shown for example in FIGS. 2 and 3, a sensor arrangement with 3D gesture detection and a plurality of touch buttons can be provided. For example, using 5 receiving electrodes and a single transmission electrode, such a device provides for single touch decoding, e.g., up to 20 positions with 5 Rx channels, and (GestiC®) 3D gesture recognition. The actual interface can be provided using a 2 layer solution (1 layer Rx structure, 1 layer solid Tx structure) on a PCB or on a display using ITO-Display integration. The controller can be integrated into a single chip solution similar to existing GestiC® single chips. For 10" display designs, for example, 20 button functions can be realized with electrodes or five electrode connections as shown in FIG. 3, wherein even more than 20 button functions are possible. Each electrode consists of a plurality of electrode segments or sections that are either directly connected to each other or connected through wiring. Formed on a printed circuit board (PCB), the segments can be connected by PCB traces. Furthermore, a slider decoding can be provided with a dedicated electrode as will be explained in more detail below.

A 3D detection controller, such as for example the GestiC® integrated circuit, can be provided with touch support without limitation to touch positions mapped to frame shaped electrodes. The GestiC® system can be enhanced to support more than 5 touche positions, for example, when only 5 Rx electrodes and therefore only 5 connections are available, while maintaining required signal pattern for 3D gesture decoding. The same electrodes provided for the 3D gesture detection can be used to provide the specific touch detection wherein no extra components are needed.

Figure 1:
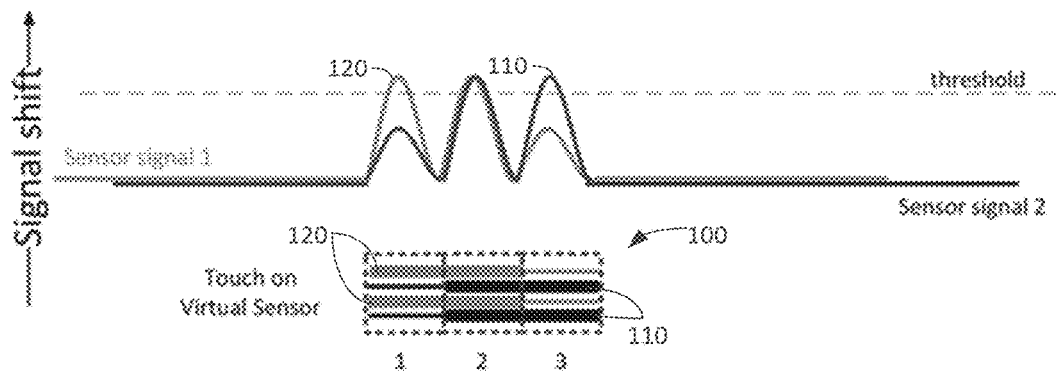
FIG. 1 shows an exemplary electrode shapes and assigned segments as well as associated signal forms.

FIG. 1 explains the principle and shows that using a 3D detection system, touch decoding can be done by the evaluation of a multitude of Rx sensor signals measured on a respective multitude of associated Rx electrodes. Considering the example case that at each touch position there are two interleaved electrodes, the decoding is done by: Detecting a touch; and Finding the 2 electrodes with the largest signal shift (out of a plurality of electrodes, e.g. 5 electrodes). Then the ratio of the signal of these 2 electrodes is analyzed for virtual touch position decoding. As shown in FIG. 1, a sensor field 100 is formed by two sensor electrodes 110, 120. Each sensor 110, 120 is split into two separate sensor segments that are electrically connected to form a single sensor. The shape of the electrodes is chosen such that the ratio of the sensor area of the two electrodes is different in each different areas of the sensor field. In the example shown in FIG. 1, the sensor field comprises three touch detection areas 1, 2, 3 that each may form a sensor button. The electrodes 110 and 120 are formed such that in the first touch detection area 1, the first electrode 110 contributes a relatively small sensor area while the second electrode 120 contributes a relatively large area. In the second touch detection area 2 both electrodes contribute the same electrode area and the third touch detection area 3, the second electrode 120 contributes a relatively small sensor area while the first electrode 110 contributes a relatively large area. The top of FIG. 1 shows associated signals that can be received from the first and second sensor electrodes 110, 120.

As further shown in FIG. 1, a threshold can be used to determine which area has been touched. In case of a touch in the first area, only the second electrode generates a signal above the threshold. In case of a touch in the second area, both electrodes generate signals above the threshold and In case of a touch in the third area, only the first electrode 110 produces a signal above the threshold.

As shown in FIGS. 2 and 3 the Rx electrodes Rx1, Rx2, Rx3, Rx4, and Rx5 are placed in an arrangement allowing to maintain standard GestiC® gesture pattern decoding. Thus, the electrodes Rx1 (320), Rx2 (340), Rx3 (330), and Rx4 (310) are arranged to frame the center electrode Rx5 (350). FIG. 2 shows a conventional electrode arrangement 200 for a gesture detection system using a quasi static alternating electric field created by a transmitter electrode. The electrodes Rx1-Rx5 are arranged on a top side of a substrate 210. FIG. 2 also shows the transmitting electrode Tx with a dashed line which is arranged on a bottom side of the substrate 210. For example, the electrodes Rx1-Rx5 can be formed by the copper layers of a double sided printed circuit board or on a display using ITO-display integration. A multi-layered printed circuit board may also be used wherein the bottom layer may be used as a ground layer to provide a shield function and the transmitting electrode may formed within an inner layer of the board.

Such an arrangement can be operated in two modes. In the first mode, the sensor arrangement operates as a conventional three-dimensional gesture detection device. Once an approach below a predefined threshold distance is detected, the device can switch into a second operating mode in which the ratios of the signals of the various electrodes are used to determine which one of a plurality of virtual buttons has been touched wherein each virtual button is associated with an area of the sensor surface. For example, the surface of the sensor shown in FIG. 2 could be divided into 9 segments as indicated by the dotted lines.

FIG. 3 shows an electrode design that basically provides a similar structure as the conventional electrode arrangement and furthermore allows the decoding of substantially more touch positions than the number of electrodes. Similar as to FIG. 2, five electrodes 310, 320, 330, 340, and 350 are arranged within a single plane. In the three-dimensional (3D) detection mode, electrode 310 operates equivalent to electrode Rx4, electrode 320 equivalent to Rx1, electrode 340 equivalent to Rx2, electrode 330 equivalent to Rx3 and electrode 350 equivalent to Rx5. Again similar to FIG. 1 a plurality of touch detection areas 1-20 each comprise a different ratio of electrode area of generally two contributing electrodes. The bottom of FIG. 3 shows the 20 touch detection areas. This grid has to be overlaid the electrode structure 300 to visualize the button association. FIG. 3 also shows with broken line a transmission electrode 360 that may be arranged on the bottom side of a substrate on which the electrodes 310-350 are arranged. The area of the transmission electrode is shown in FIG. 3 to be larger than the area covered by the electrodes 310-350. However, the area can also be substantially the same or smaller.

Thus, using the decoding technique according to various embodiments, the sensor arrangement maintains the general frame design and is thereby able to support a plurality of touch position which is substantially greater than the number of electrodes. In the embodiment of FIG. 3 up to 20 or more touch positions can be formed with only 5 electrodes. A limit of up to 20 positions provide for a good manual operation on a 10' display. However, more or less touch position can be realized depending on the size of the display and the number of actual electrodes.

Figure 4:
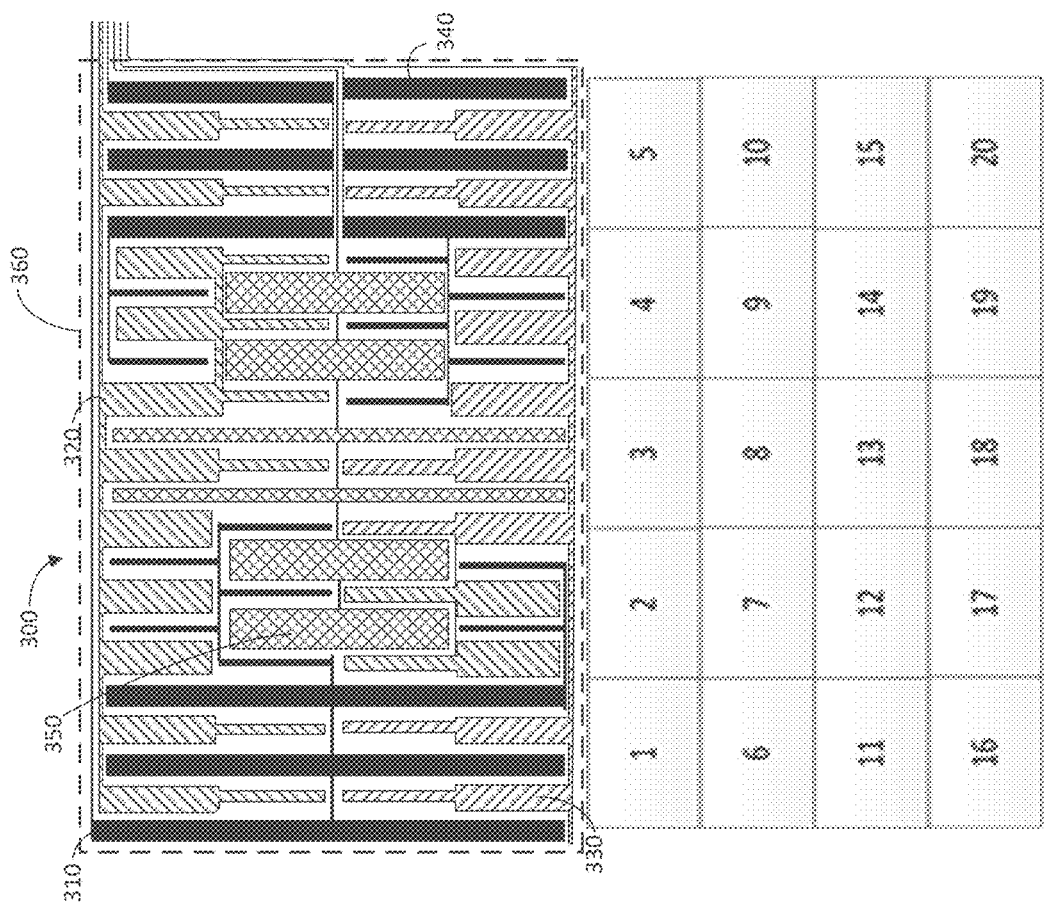
FIG. 4 shows a display unit using an electrode structure according to various embodiments.

FIG. 4 shows an example of respective displays with such functionality. A small display as the one shown in FIG. 4 may have a limited number of buttons due to its size.

The specific electrode pattern as shown in FIG. 3 still provides good signal patterns for 3D gesture decoding. For such gesture decoding, certain characteristics of the received signal patterns are evaluated. For example, the signal pattern for a West-to-East (left-to-right) flick gesture is expected to first have a maximum in the West electrode's received signal and then a maximum in the East electrode's received signal, or analogously zero-crossings in the first derivatives of respective signals with respect to time. Also, the second derivatives with respect to time or other signals deduced thereof can be used for evaluation. In order to use standard gesture recognition firmware—designed for frame shape electrodes as in FIG. 1—also for new electrode designs, the temporal order of such maxima or zero-crossings on the received signals or signals deduced thereof need to be the same as for the frame shape design.

This will be maintained by the electrode placement described in the various embodiments and/or by fast processing power of the data acquisition and decoding. The information of more than 2 electrodes in each axis will increase the reliability of the sensor.

As shown in the various embodiments, the Rx electrodes may be arranged in a single layer. However, the Rx electrode arrangement in such a design is not limited to a single layer.

The design is not limited to two different density levels for decoding. The design is also not limited to five Rx electrodes and the design is not limited to use just two of the plurality of electrodes for touch decoding.

The design is further not limited to the electrode pattern shown in the examples. The specific interleaved electrode design as shown in FIG. 3 establishes a pattern that provides distinct signal density levels depending on the location. Thus, the various electrodes are shaped such that they contribute different area sizes in the virtual button zones to be able to distinguish between the various virtual button zones. The electrode pattern can vary, depending on the design it may be important, that the pitch of the interleaved design is not larger than a finger pitch, so that a touch by a small and large finger result always in the same or similar ratio between the contributing (touched) electrodes, for example the two of five electrodes in the embodiment of FIG. 3. More precisely, the pitch of the touching object— e.g. the finger—to be detected needs to be larger than the pitch of the interleaved design. As can be seen from the pattern in FIG. 3, each buttons area is assigned to two receiving electrodes whose sensor area varies depending on the button location.

Figure 5:
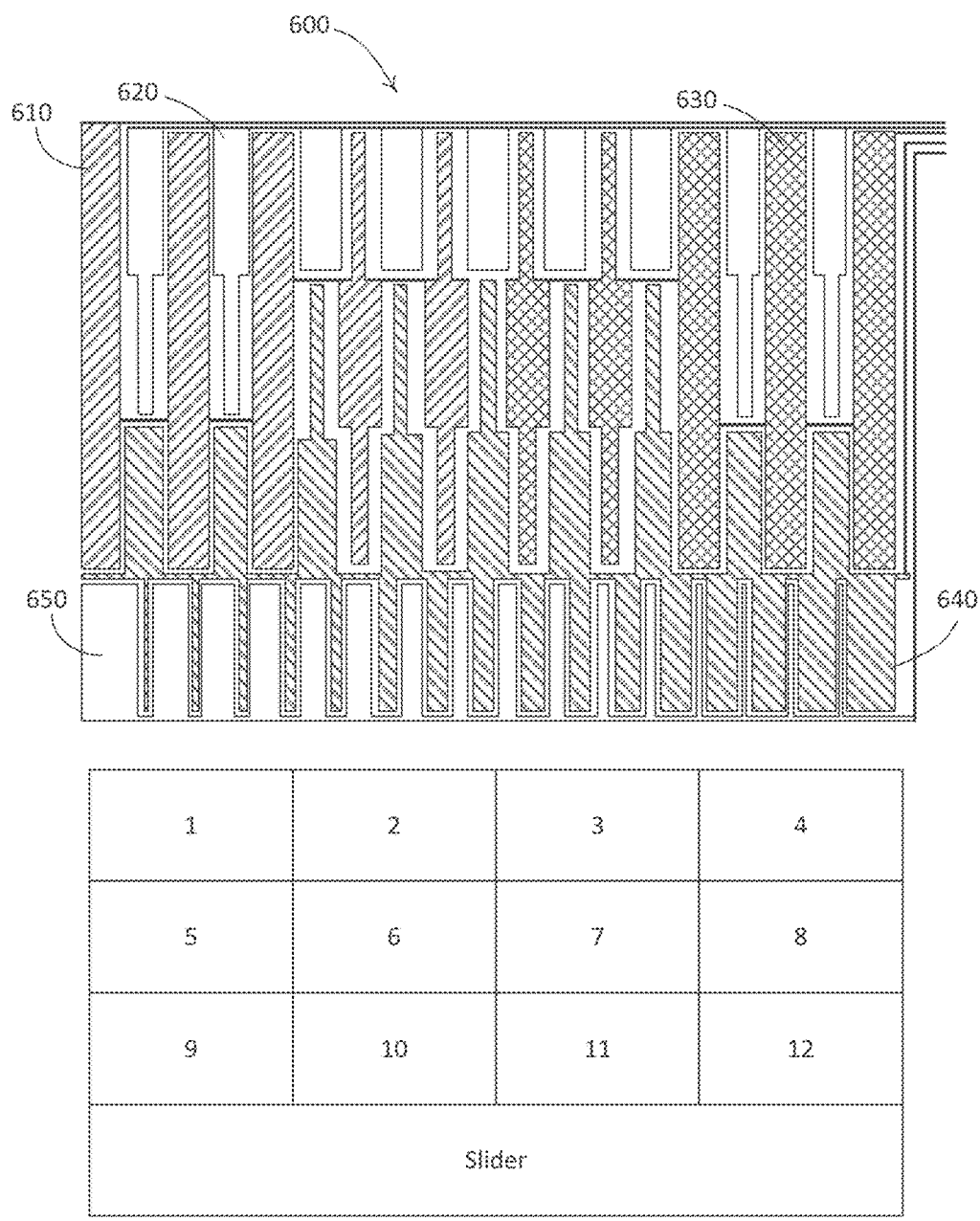
FIG. 5 shows an electrode structure according to a third embodiment.

FIG. 5 shows yet another possible electrode layout 600 that establishes 12 touch buttons and a slider function at the bottom. This arrangement uses 5 electrodes 610, 620, 630, 640, and 650. In the 3D gesture detection mode, electrode 610 operates as the RX4 of the conventional arrangement shown in FIG. 2, electrode 620 operates similar to Rx1, electrode 630 similar to Rx2, and electrode 640 similar to Rx4. In the touch detection mode, these four electrodes are used to form 12 virtual buttons 1-12 wherein always two of the four electrodes 610, 620, 630, and 640 are used to define respective virtual button areas. In other words, always two of the four electrodes 610, 620, 630, and 640 contribute to a virtual button field 1-12, wherein different ratios of electrode areas are established through respective shapes of the electrodes.

Again, FIG. 5 shows at the bottom the respective virtual buttons and a slider area wherein this grid is to be overlaid the electrode structure 600 to show the association. For the first three rows that comprise the virtual buttons it can be seen, that electrode 620 contributes approximately the same electrode area to each virtual button field 1-4 whereas electrodes 610 and 630 contribute to field 1, 2 and 3, 4 with different electrode areas, respectively. In the second row, electrodes 610 and 630 contribute approximately the same electrode area to virtual fields 5, 6 and 7, 8, respectively, electrode 620 contributes to virtual field 5 and 8 whereas electrode 640 contributes to virtual fields 6 and 7. In the third row, the electrodes are shaped such that electrode 640 contributes approximately the same electrode area to each virtual field 9-12 whereas electrodes 610 and 630 contribute different electrode area sizes to virtual fields 9, 10 and 11, 12, respectively.

In addition, a fifth electrode 650 together with electrode 640 provide for a slider function at the bottom of the electrode arrangement. To this end, the horizontal slider provides a varying electrode area ratio between the two electrodes 640 and 650 along a horizontal x axis at the bottom of the electrode structure 600. The two electrodes 640 and 650 are arranged in interdigital fashion wherein the width of the fingers of the electrodes vary from small to large for one electrode and from large to small for the respective other electrode.

In summary, this electrode structure provides four electrodes 610-640 for 3D detection that are arranged in a frame like manner. An additional electrode 650 is interleaved with the N-electrode to provide for an additional slider functionality. FIG. 5 does not show the transmission electrode. However, the same principles for the transmission electrode as shown in FIG. 3 apply.

The full potential of multi-signal decoding for touch detection, e.g. (coarse) 2D touch position detection can be exploited with an electrode design according to various embodiments. The design according to FIGS. 3 and 5 is limited to having the Tx electrode underneath the Rx electrodes, which does not practically allow 3D-boosted systems which promise higher detection range. According to various embodiments, meander-shape electrodes can be used in order to place more than just two electrodes underneath a fingertip on a single layer.

When touching a sensor with a finger, the finger is covering a certain area of the sensor's cover plate. This yields a strongly increased capacitive coupling between the finger and the electrode(s) underneath the finger compared to the case of no finger touch. When multiple Rx electrodes are located underneath the area covered by the fingertip, the area of each electrode underneath the covered area determines the signal level changes on the respective Rx channels—because this area determines the capacitive coupling to the finger assuming that a (touch) button area is larger than a fingertip. When the signal levels (or level changes) are rather independent of where exactly within this touch area the fingertip is touching, these signal levels (or signal level changes) are characteristic for the respective button and can be evaluated/decoded to identify the button.

The 'electrode density' of a touch position is defined as the typically covered area of the respective electrode with a typical fingertip. A button area as shown in the bottom section of FIGS. 3 and 5 is therefore a connected area of the sensor where electrode density is approximately constant.

When the electrode density does not only vary between dedicated touch button areas, but more gradually, a higher position resolution can be achieved, as also shown by means of the "Slider" in FIG. 5. For example, let the density of the West electrode 650 decrease from the West (left) border of the sensor area inwards, then moving a touching finger by some amount from West into East direction ('x-direction') will decrease the capacitive coupling between West electrode 650 and the fingertip, and hence increase (or decrease, depending on system) the respective Rx signal level. Both the West and the East electrodes' (650, 640) Rx signals carry information about the touch's x-position, and hence—in layouts where both West and East electrodes 650, 640 are covered by a fingertip simultaneously—West and East electrodes' Rx signals can be evaluated jointly. Analog, the same holds for North and South electrodes and the touch's y-position.

In order to enhance the feature set an electrode layout as shown in FIG. 5, (touch button and 1D slider decoding, 2-layer design), it is necessary to increase the number of electrodes covered by the fingertip to more than two. To do so, there are (at least) two solutions:

1. Multi-layer designs with vias: Interleaving of 3+ electrodes.
2. Introduction of a meander-like electrode layout for at least one electrode according to various embodiments of this application.

Solution #2 allows are variety of new designs:

GestIC(3D gesture detection) and Buttons (Slider) Solution

According to various embodiments, the RX and TX electrodes can be arranged within a single-layer design: Each button area needs at least two Rx electrodes and a Tx electrode—any of which can be the one doing meanders.

This design allows for large designs where current two-layer solution has too much Tx-Rx coupling. Furthermore, this design allows for 3D-boosted systems for detection range extension and is less expensive to be manufactured. In a two layer design, the backside can be flat ground shield, or stay completely unused (depending on needs for backside shielding).

According to some embodiments with a transmission electrode Tx on the backside, a receiving electrode design can have three receiving electrodes in each button area without the need for vias, which leads to an increased number of buttons, even for displays/transparent electrode carriers (where no vias are possible).

According to other embodiments, an optional ground shield layer is provided at the backside. Such a layer can be solid which is less expensive to manufacture than a mesh design.

GestIC+2D Position (2D Slider)

With an increasing number of electrodes covered by a fingertip, it is possible not only to increase the number of touch buttons, but also to extend the 'slider' approach to more dimensions, making 2D (single-touch) positioning possible by gradually varying the (local) electrode density. Such (coarse) positioning also allows sliding detection in two dimensions, e.g. horizontally and vertically.

An optional Rx electrode ring (e.g. Center electrode) around the layout can be used to detect touches at borders/outside of sensor area, and to use this information to reject respective touches.

In the following, examples for electrode/sensor layouts with meander-like electrodes are presented. All of which share the property that—as required for GestIC 3D gesture detection—the density of the North or top electrode is highest in the 'north' (top) and smallest in the 'south' (bottom), the West or left electrode's density is highest in the 'west' (left) and smallest in the 'east' (right), and so on.

Figure 6A:
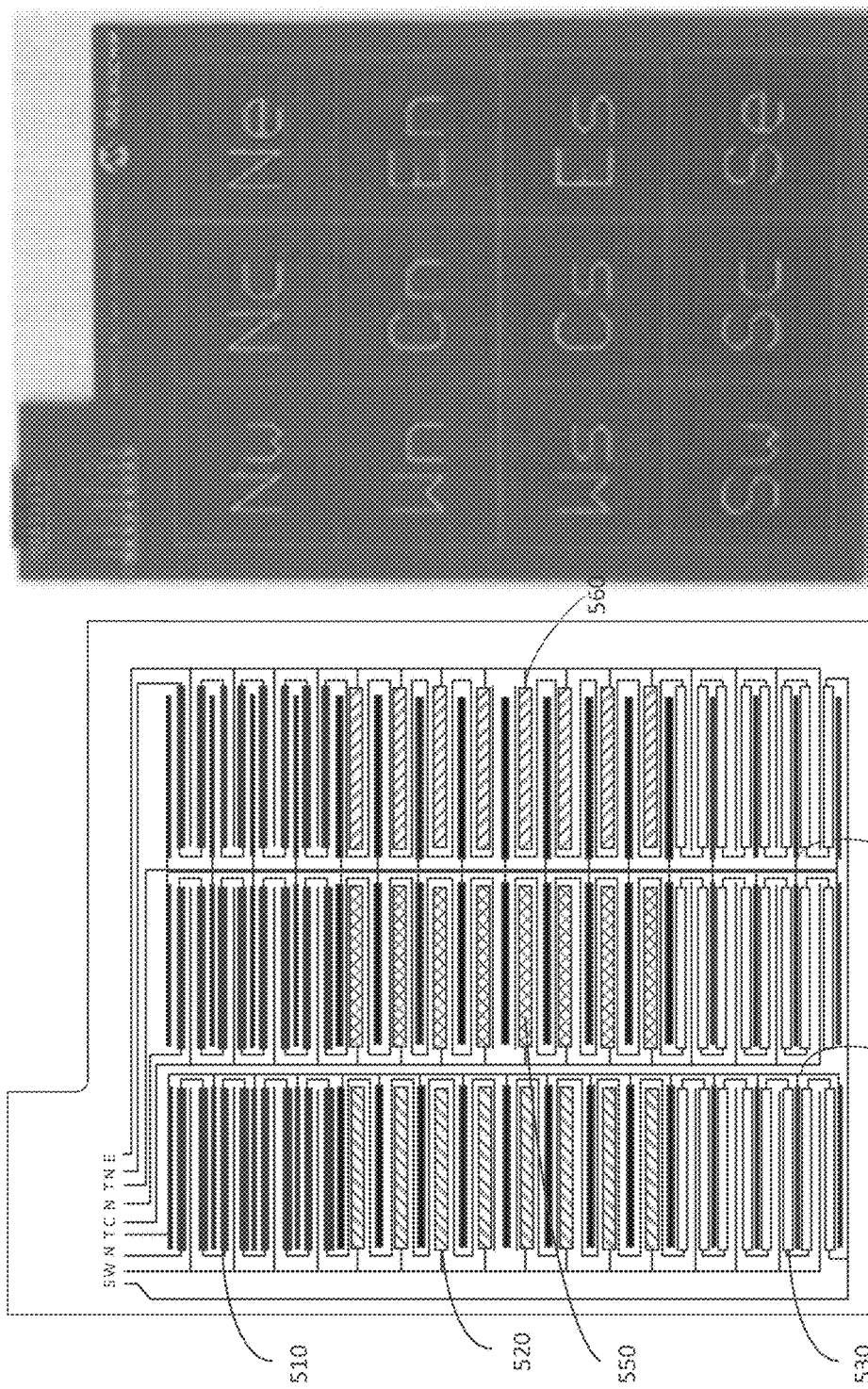

FIGS. 6A and 6B show a Single-Layer GestIC+Buttons sensor layout. FIG. 6A shows the single layer layout and the associated button segments on the right side of FIG. 6A.

FIG. 6B shows the same design and on the right side a magnified section including a typical exemplary fingertip area. As shown in FIG. 6A, the design contains 12 dedicated button areas Nw, Nc, Ne, Wn, Cn, En, Ws, Cs, Es, Sw, Sc, and Se, each of which comprising electrodes of two Rx channels of the plurality of receiving electrodes 510, 520, 530, 550, and 560 and the electrodes 540 for the Tx channel. In this example, the Tx electrodes 540 are horizontally oriented, at constant vertical distance from each other, and the corresponding feeding lines are routed vertically in the two gaps between the columns of the button areas. North and South electrodes 510 and 530 are meander-like going around West, Tx and East electrodes 520, 540, 560. Optionally, a ground (shield) layer can be employed, for example, on the backside of the electrode carrier such as a printed circuit board to shield interferers. FIG. 6A shows on the right side a photographic representation of a prototype printed circuit board forming such a sensor pattern.

Figure 7:
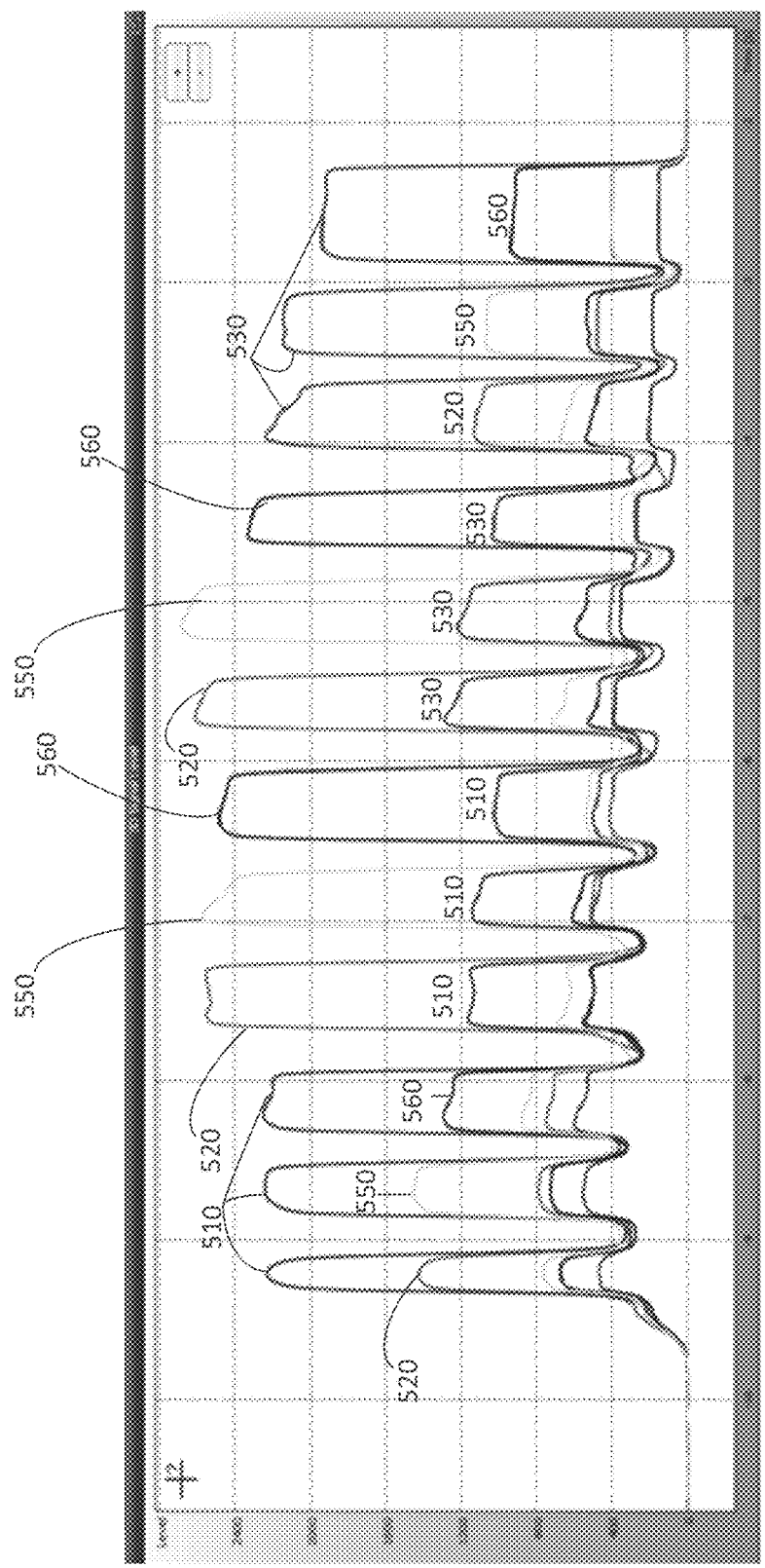
FIG. 7 shows signals from an electrode structure according to FIGS. 6A and 6B.

FIG. 7 shows the signal deviation (i.e. baseline-corrected signal level) when successively touching all twelve button areas (Nw..Se) of the GestIC+Buttons design in FIG. 6A, revealing distinct highest and $2^{nd}$ highest signal level for the two Rx electrodes with highest and 2nd highest electrode density in each respective button area. The reference labels refer to the respective signal provided by electrodes 510, 520, 530, 550, and 560.

Figure 8:
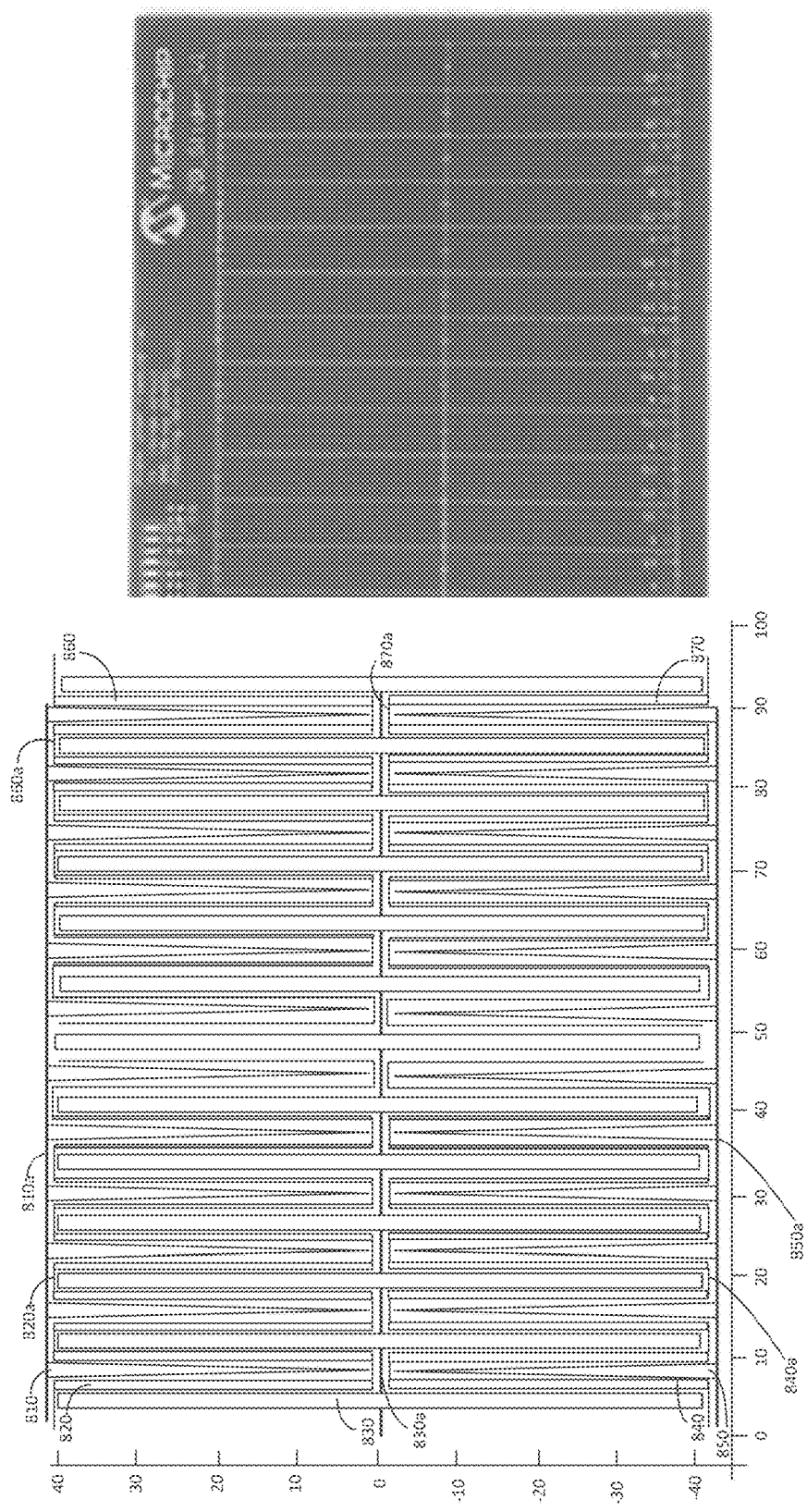
FIG. 8 shows an electrode structure and a PCB according to a fifth embodiment.

FIG. 8 shows yet another embodiment of a GestIC+2D slider sensor design where the center electrode 830 has approximately a constant density over all the sensor surface area. Here, the center electrode 830 is split into a plurality of rectangular segments connected by a center trace 830a. Hence, its Rx signal can be well utilized for touch event detection, e.g. using threshold comparison. The touch position can be decoded with the Rx signal levels of the remaining electrodes 810, 820, 840, 850, 860 and 870. Each electrode 810, 820, 840, 850, 860 and 870 consists of a plurality of segments connected by respective PCB traces 810a, 820a, 830a, 840a, 850a, 860a, and 870a. Electrodes 810 and 850 each comprise a plurality of triangular shaped electrode segments connected by straight PCB traces 810, 850, respectively whereas electrodes 820, 850, 860 and 870 comprise rectangular electrode segments that are connected by respective traces 820a, 850a, 860a, and 870a in a meander fashion. While North electrode 810 and South electrode 850 reach into the sensor from the outside with gradually decreasing density towards the inside, the West electrodes 820 and 840 and East electrodes 860 and 870 are extending towards the sensor area's center in a meander-like manner, where the electrode densities are gradually decreasing from West to East for the West Electrodes, and from East to West for the East electrodes, respectively. FIG. 8 shows on the right side a photographic representation of a prototype printed circuit board forming such a sensor pattern.

Figure 9:
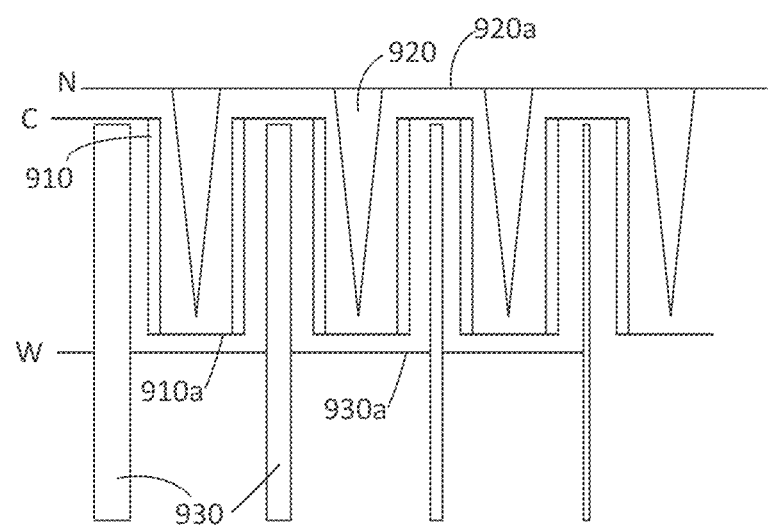
FIG. 9 shows details of an electrode structure according to sixth embodiment.

FIG. 9 shows a more detailed view of a similar electrode pattern as shown in FIG. 8 wherein a Center channel electrode C is formed by meander-like arranged rectangular electrode segments 910 connected by respective PCB traces 910a. A West electrode W here is formed by rectangular segments 930 varying in size such that a width of the rectangular electrode segments 930 decreases towards a center of the sensor arrangement. An East electrode (not shown in FIG. 9) would be formed similarly wherein a width would decrease from right to left. The North electrode N is again formed by triangular segments 920 connected through a straight PCB trace 920 which may run along a top border of the sensor arrangement. A South electrode S would be formed in similar fashion extending from a bottom border to the middle of the sensor arrangement similar to the electrode arrangement shown in FIG. 8. This layout has the advantage that the pitch between two neighboring West (East) electrode segments 930 is equal to the pitch between two neighboring North (South) electrodes, and more homogenous signals can be expected.

Figure 10:
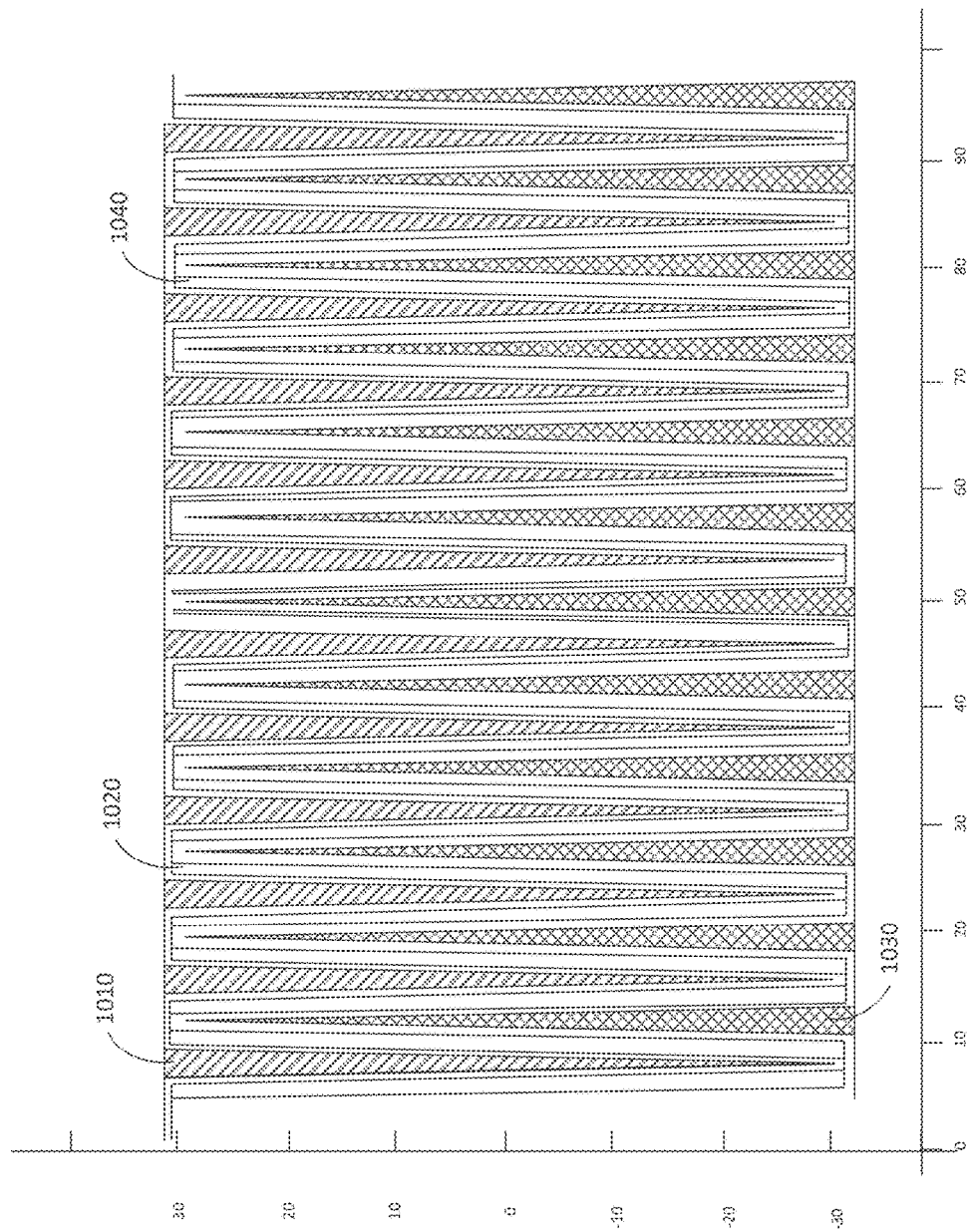
FIG. 10 shows an electrode structure according to a seventh embodiment.

FIG. 10 shows another example for a GestIC+2D Slider design with four electrodes. North and South electrodes 1010 and 1030 are again formed by triangular electrode segments connected by a top and a bottom trace, respectively. The West and East electrodes 1020, 1040 comprises a plurality of rhomboids with decreasing width towards the center. Each rhomboid is arranged between two neighboring triangle electrodes of the North and South electrode and alternating connection traces on top and bottom form meander shaped electrodes as shown in FIG. 10.

For 2D (two dimensional) touch detection, the average density of North electrode segments 1010 and South electrode segments 1030 is approximately constant over the entire sensor area. Hence, the summed signal deviation (signal level change due to touch) of North and South channel can be used to detect the touch event, and then the touch position can be evaluated using the information from all four channels 1010, 1020, 1030, and 1040. Additionally, a center channel could be used by putting an electrode ring around the shown design, indicating when a touch is happening outside the desired touch area but on a feeding line.

Figure 11:
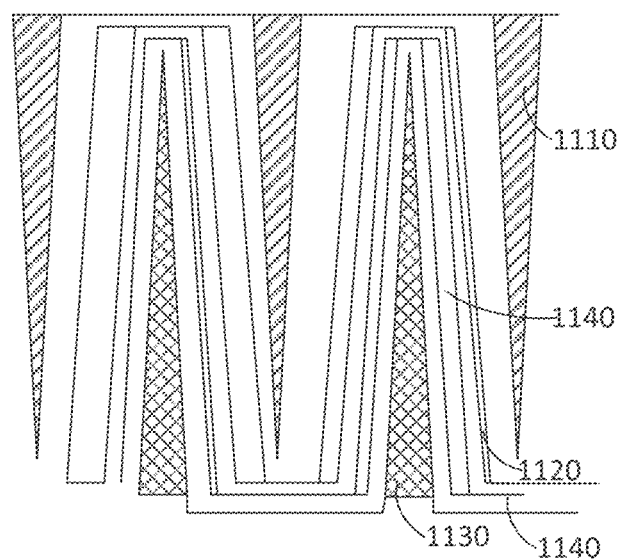
FIG. 11 shows details of an electrode structure according to an eighth embodiment.

FIG. 11 shows an extract of a sensor similar to the one shown in FIG. 10, wherein all four GestIC 'frame' electrodes, i.e. South, West, North and East, are reaching over the entire sensor area, but with varying density. As shown in more detail in FIG. 11, to vary the density, the North and South electrodes 1110 and 1130 have again triangular shaped electrode segments. The West and East electrodes are arranged differently with respect to FIG. 10 in so far that their segments are spread over the entire sensor area. The West and East electrodes 1120 and 1140 vary a segment width from segment to segment. The width of the rhomboid segments of the West electrode 110 decreases from left to right whereas the width of the rhomboid segments of the East electrode 1140 increases from left to right. Again similar as in FIG. 10, the West and East electrodes 1120 have meander shape but are intertwined contrary to the arrangement of FIG. 10. The sensor segments are arranged such that the (average) density of North and South is constant, and also the average density of West and East. A drawback of this design is that the pitch between electrodes is increased: For example, between two 'arms' of the South electrode, there are five other electrode lines: West and East each twice, and North.

The term 'meander shape' of an electrode is to be understood as follows: The electrode is not straight, but has several turns (typically 90 degrees), partially encapsulating other electrodes (typically on three of four sides). After two turns of typically 90 degrees in one direction—typically with a longer segment followed by a shorter connecting' segment—follow two turns of typically 90 degrees in the opposite direction, again first with a longer and then a shorter segment, and so on. The thickness of the electrode may vary between different segments of the electrode, whereas the connecting segments typically have minimum thickness in order to minimize their influence to the capacitive network.

In summary, a meander-like electrode layout fitting three or more interleaved (and thus upon a fingertip touch simultaneously covered) electrodes in a single layer, allows for a single-layer GestIC+Buttons Solution which leads to production cost saving. Moreover, multi-layer GestIC+2D Slider Solution which leads to new features can be accomplished all just with one integrated circuit, such as the gesture controller MGC3130/3030 manufactured by applicant.

The invention claimed is:

1. A sensor arrangement for capacitive touch and non-touch detection, comprising a transmission electrode and a predefined number of receiving electrodes coupled with an evaluation unit, wherein the evaluation unit operates in a non-touch detection mode and in a touch detection mode, wherein the transmission electrode generates an alternating electric near field, and
   in the non-touch detection mode, the evaluation unit evaluates signals from the receiving electrodes to determine non-touch gestures or a three-dimensional position of an object; and
   in the touch detection mode a surface touch detection area defined by the predefined number of electrodes is divided into a plurality of area segments wherein within each area segment at least two electrodes of the predefined number of electrodes contribute with a portion of their electrode surface area such that different electrode surface area ratios are formed for each of the plurality of area segments,
   wherein at least one receiving electrode or the transmission electrode is formed by a plurality of electrode segments connected to form a single string of electrode segments and wherein the string of electrode segments is arranged to meander around at least one other receiving electrode or the transmission electrode thereby creating a plurality of turns wherein each turn encompasses an electrode segment of the at least one other receiving electrode or the transmission electrode, respectively.

2. The sensor arrangement according to claim 1, wherein each segment defines a virtual touch button and the number of virtual touch buttons is greater than the number of electrodes.

3. The sensor arrangement according to claim 1, wherein each segment comprises two contributing receiving electrodes.

4. The sensor arrangement according to claim 1, wherein each segment comprises three contributing receiving electrodes.

5. The sensor arrangement according to claim 3, wherein an electrode surface area of each of the two contributing receiving electrodes within a segment is selected from a first surface area and a second surface area, wherein the first surface area is larger than the second surface area.

6. The sensor arrangement according to claim 1, wherein the predefined number of electrodes is five and signals from at least four receiving electrodes are used in the non-touch detection mode.

7. The sensor arrangement according to claim 1, wherein the predefined number of electrodes is four and signals from all four receiving electrodes are used in the non-touch detection mode.

8. The sensor arrangement according to claim 1, wherein the predefined number of electrodes are arranged in an interleaved fashion, wherein in the non-touch gesture detection mode four of the electrodes of the predefined number of electrodes provide for a frame-like arrangement.

9. The sensor arrangement according to claim 2, wherein a touch of a virtual touch button is decoded by two contributing electrodes from the plurality of receiving electrodes.

10. The sensor arrangement according to claim 9, wherein the two contributing electrodes are selected from the plurality of electrodes by signal strength of signals received by a respective receiving electrode.

11. The sensor arrangement according to claim 1, wherein the predefined number of receiving electrodes is five and the five receiving electrodes are arranged in an interleaved fashion to provide said plurality of segments, wherein the segments are arranged in a matrix covering the surface touch detection area.

12. The sensor arrangement according to claim 11, wherein the matrix provides for 5×4 segments.

13. The sensor arrangement according to claim 11, wherein the matrix provides for 3×4 segments and wherein two of the five receiving electrodes provide for an additional slider function.

14. The sensor arrangement according to claim 1, wherein two of the receiving electrodes are arranged in interdigital fashion, each receiving electrode having a plurality of fingers, and wherein a width of the fingers of each electrode is varied to provide for an slider function.

15. The sensor arrangement according to claim 1, wherein each receiving electrode has a plurality of fingers and wherein pairs of receiving electrodes are arranged in interdigital fashion along a line to form a row of adjacent segments, each segment defining a virtual button.

16. The sensor arrangement according to claim 15, wherein the line is a straight line.

17. The sensor arrangement according to claim 15, wherein the line is curved.

18. The sensor arrangement according to claim 1, wherein four electrodes are arranged in an interleaved fashion to provide for twelve touch locations.

19. The sensor arrangement according to claim 1, wherein the transmission electrode and a predefined number of receiving electrodes are arranged in the same layer and wherein the transmission electrode comprises a plurality of fingers extending from a feed line and at least one receiving electrode is arranged to meander around a predefined number of said fingers.

20. The sensor arrangement according to claim 1, wherein the transmission electrode and a predefined number of receiving electrodes are arranged in the same layer.

21. The sensor arrangement according to claim 1, wherein the electrode density of at least one electrode gradually increases or decreases along a direction of the electrode arrangement.

22. The sensor arrangement according to claim 1, wherein the electrode density of at least two electrodes gradually increases or decreases along a direction of the electrode arrangement.

23. A method for performing a capacitive touch and non-touch detection, the method comprising feeding an alternating signal to a transmission electrode to generate an alternating electric near field and operating an evaluation unit coupled with a predefined number of receiving electrodes in a non-touch detection mode and in a touch detection mode, wherein
in the non-touch detection mode, the evaluation unit evaluates signals from the receiving electrodes to determine a three-dimensional position of an object; and
in the touch detection mode a surface touch detection area defined by the predefined number of receiving electrodes is divided into a plurality of segments wherein within each segment at least two electrodes of the predefined number of electrodes contribute with a portion of their electrode surface area such that different electrode surface area ratios are formed for each of the plurality of segments and wherein the evaluation unit evaluates signals from a variety of at least two of the predefined number of receiving electrodes to determine a touch location,
wherein at least one receiving electrode or the transmission electrode is formed by a plurality of electrode segments connected to form a single string of electrode segments and wherein the string of electrode segments is arranged to meander around at least one other receiving electrode or the transmission electrode thereby creating a plurality of turns wherein each turn encompasses an electrode segment of the at least one other receiving electrode or the transmission electrode, respectively.

24. The method according to claim 23, wherein each segment defines a virtual touch button and the number of virtual touch buttons is greater than the number of electrodes.

25. The method according to claim 23, wherein each segment comprises two contributing receiving electrodes.

26. The method according to claim 25, wherein an electrode surface area of each of the two contributing receiving electrodes within a segment is selected from a first surface area and a second surface area, wherein the first surface area is larger than the second surface area.

27. The method according to claim 23, wherein the predefined number of electrodes is five and signals from all five receiving electrodes are used in the non-touch detection mode.

28. The method according to claim 23, wherein the predefined number of electrodes is four and signals from all four receiving electrodes are used in the non-touch detection mode.

29. The method according to claim 23, wherein the predefined number of electrodes are arranged in an interleaved fashion, wherein in the non-touch gesture detection mode four of the electrodes of the predefined number of electrodes provide for a frame-like arrangement.

30. The method according to claim 24, wherein a touch of a virtual touch button is decoded by two contributing electrodes from the plurality of receiving electrodes.

31. The method according to claim 30, wherein the two contributing electrodes are selected from the plurality of electrodes by signal strength of signals received by a respective receiving electrode.

32. The method according to claim 23, wherein two of the receiving electrodes are arranged in interdigital fashion, each receiving electrode having a plurality of fingers, and wherein a width of the fingers of each electrode is varied, the method further comprising evaluating signals from said two of the receiving electrodes to provide for an slider function.

33. The method according to claim 23, wherein the transmission electrode and a predefined number of receiving electrodes are arranged in the same layer and wherein the transmission electrode comprises a plurality of fingers extending from a feed line and at least one receiving electrode is arranged to meander around a predefined number of said fingers.

34. The sensor arrangement according to claim 1, wherein the sensor arrangement is operating in the non-touch mode and automatically switches into the touch detection mode upon detection of an object being below a predefined threshold distance to a touch surface.

35. The method according to claim 23, wherein the sensor arrangement is operating in the non-touch mode and automatically switches into the touch detection mode upon detection of an object being below a predefined threshold distance to a touch surface.

36. A sensor arrangement for capacitive touch and non-touch detection, comprising a transmission electrode and a predefined number of receiving electrodes coupled with an evaluation unit, wherein the evaluation unit operates in a non-touch detection mode and in a touch detection mode, wherein the transmission electrode generates an alternating electric near field, and
- in the non-touch detection mode, the evaluation unit evaluates signals from the receiving electrodes to determine non-touch gestures or a three-dimensional position of an object; and
- in the touch detection mode a surface touch detection area defined by the predefined number of electrodes is divided into a plurality of segments wherein within each segment at least two electrodes of the predefined number of electrodes contribute with a portion of their electrode surface area such that different electrode surface area ratios are formed for each of the plurality of segments,
- wherein at least one receiving electrode and the transmission electrode are arranged such that one of the at least one receiving electrode and the transmission electrode comprises a plurality of parallel arranged interconnected fingers and the respective other one of the at least one receiving electrode and the transmission electrode is formed by a plurality of electrode segments connected to form a single string of electrode segments and wherein the string of electrode segments is arranged to meander around the fingers of the one of the at least one other receiving electrode or the transmission electrode.

37. The sensor arrangement according to claim 36, wherein at least some of the plurality of fingers vary in a finger width and/or at least some of the electrode segments vary in a segment width.

\* \* \* \* \*